United States Patent
Wijeratne et al.

(10) Patent No.: US 7,656,702 B2
(45) Date of Patent: Feb. 2, 2010

(54) ULTRA LOW VOLTAGE, LOW LEAKAGE, HIGH DENSITY, VARIATION TOLERANT MEMORY BIT CELLS

(75) Inventors: Sapumal Wijeratne, Portland, OR (US); Matthew W. Ernest, Hillsboro, OR (US); Brian A. Kuns, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 202 days.

(21) Appl. No.: 12/006,288

(22) Filed: Dec. 31, 2007

(65) Prior Publication Data
US 2009/0168509 A1 Jul. 2, 2009

(51) Int. Cl.
*G11C 11/40* (2006.01)
(52) U.S. Cl. .................. 365/181; 365/154; 365/190

(58) Field of Classification Search ............ 365/181
See application file for complete search history.

(56) References Cited

U.S. PATENT DOCUMENTS

| | | | | |
|---|---|---|---|---|
| 4,912,675 A * | 3/1990 | Blake et al. | ............ | 365/154 |
| 4,956,815 A * | 9/1990 | Houston | ............ | 365/154 |
| 5,046,044 A * | 9/1991 | Houston et al. | ............ | 365/156 |
| 6,208,554 B1 * | 3/2001 | Phan et al. | ............ | 365/154 |
| 6,262,932 B1 * | 7/2001 | Nguyen | ............ | 365/230.05 |
| 6,285,580 B1 * | 9/2001 | Phan et al. | ............ | 365/156 |
| 7,286,390 B2 * | 10/2007 | Yokoyama | ............ | 365/154 |
| 7,492,627 B2 * | 2/2009 | Russell et al. | ............ | 365/154 |

* cited by examiner

*Primary Examiner*—Tan T. Nguyen
(74) *Attorney, Agent, or Firm*—Caven & Aghevli LLC

(57) ABSTRACT

Methods and apparatus to provide ultra low voltage, low leakage, high density, and/or variation tolerant memory bit cells are described. In one embodiment, each of the cross-coupled invertors of a memory cell may include a plurality of p-channel transistors. Other embodiments are also described.

15 Claims, 4 Drawing Sheets

ULTRA LOW VOLTAGE, LOW LEAKAGE, HIGH DENSITY, VARIATION TOLERANT MEMORY BIT CELLS

BACKGROUND

The present disclosure generally relates to the field of electronics. More particularly, an embodiment of the invention relates to ultra low voltage, low leakage, high density, and/or variation tolerant memory bit cells.

As processors increase their processing capabilities, one concern is the amount of additional power consumed by these processors. Increased power consumption may increase heat dissipation issues, decrease battery longevity, and increase the likelihood of thermal damage. To counter these issues, some processors may be operated at lower voltage levels. However, some processor's low voltage performance and yield may be limited by dense memory bit cells. ECC (Error Correction Code) may be utilized to improve yield in some implementation. But, ECC may not be viable for most register files (formed by the memory bit cells) that may be sprinkled across a processor, in part, because the increase in latency due to ECC operations can be prohibitive. Upsizing register file memory bit cells may improve low voltage operations but may also result in lost density and may further fail to solve scaling issues going forward.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Some of the embodiments discussed herein may provide techniques for ultra low voltage, low leakage, high density, and/or variation tolerant memory bit cells. In an embodiment, such bits may be used for a register file, which generally refers to a collection of memory bit cells accessed as registers by logic (such as a processor execution unit or other logic within a processor) for storing data. In an embodiment, techniques provided herein may significantly improve low voltage performance for about a 10-12% increase in bit cell area. Moreover, some embodiments may be provided in various environments, such as those discussed herein with reference to the figures.

Figure 1:
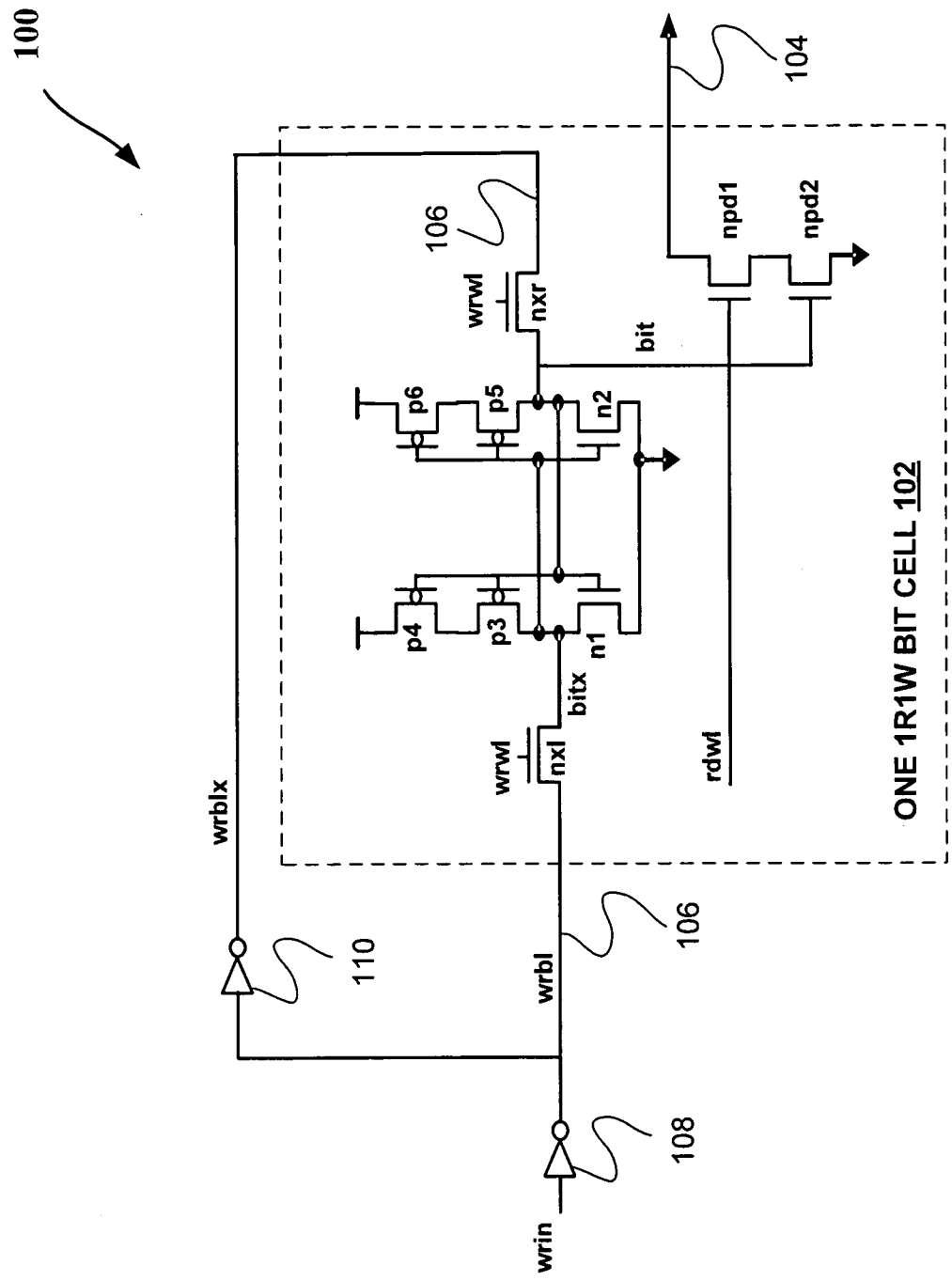
FIGS. 1 and 4 illustrate block diagrams of various components that may be used in a memory bit cell, according to some embodiments.

FIG. 1 illustrates a block diagram 100 of various components that may be used in a memory bit cell, according to an embodiment. The memory bit cell 102 may include one read port 104 and one write port 106 (1R1W). As shown in FIG. 1, the write port 106 may use an eight-transistor dual ended structure (including transistors nx1, nxr, n1, n2, p3, p4, p5, and p6) that is controlled by the write word line (wrwl) signal. As shown in FIG. 1, the bit cell 102 may include two cross-coupled invertors, e.g., where a first invertor is formed by {p3,p4,n1} transistors and a second invertor is formed by {p5,p6,n2} transistors. The data input to the write port 106 may be dual rail signals wrbl and wrblx that provide opposite polarities by passing the written in value (wrin) through invertors 108 and 110. The remaining two devices npd1 and npd2 make up the read port 104 which is controlled by the read word line signal rdwl.

Generally, in order to ensure that the memory bit stores the written in value (wrin), it is required that the bit and bitx complete more than 50% of the intended transition at the point of write word line deassertion. For register files in which reads may occur immediately after writes, it is generally important that the write 1 completion level be greater than or equal to 80% at the point of read word line assertion. This is because a poor write 1 completion level may result in very low, or zero, overdrive voltage for the bottom n-channel transistor (e.g., n-channel Field Effect Transistor (nFET)) npd2 of the read port, which fires substantially coincident with end of write operation. Since there could be millions of register file memory bits in a processor, it may also be necessary to include random and systematic variation during low voltage performance verification of these structures. For this reason, circuits that offer better low voltage performance are generally also those circuits that have superior variation tolerance characteristics.

Figure 4:
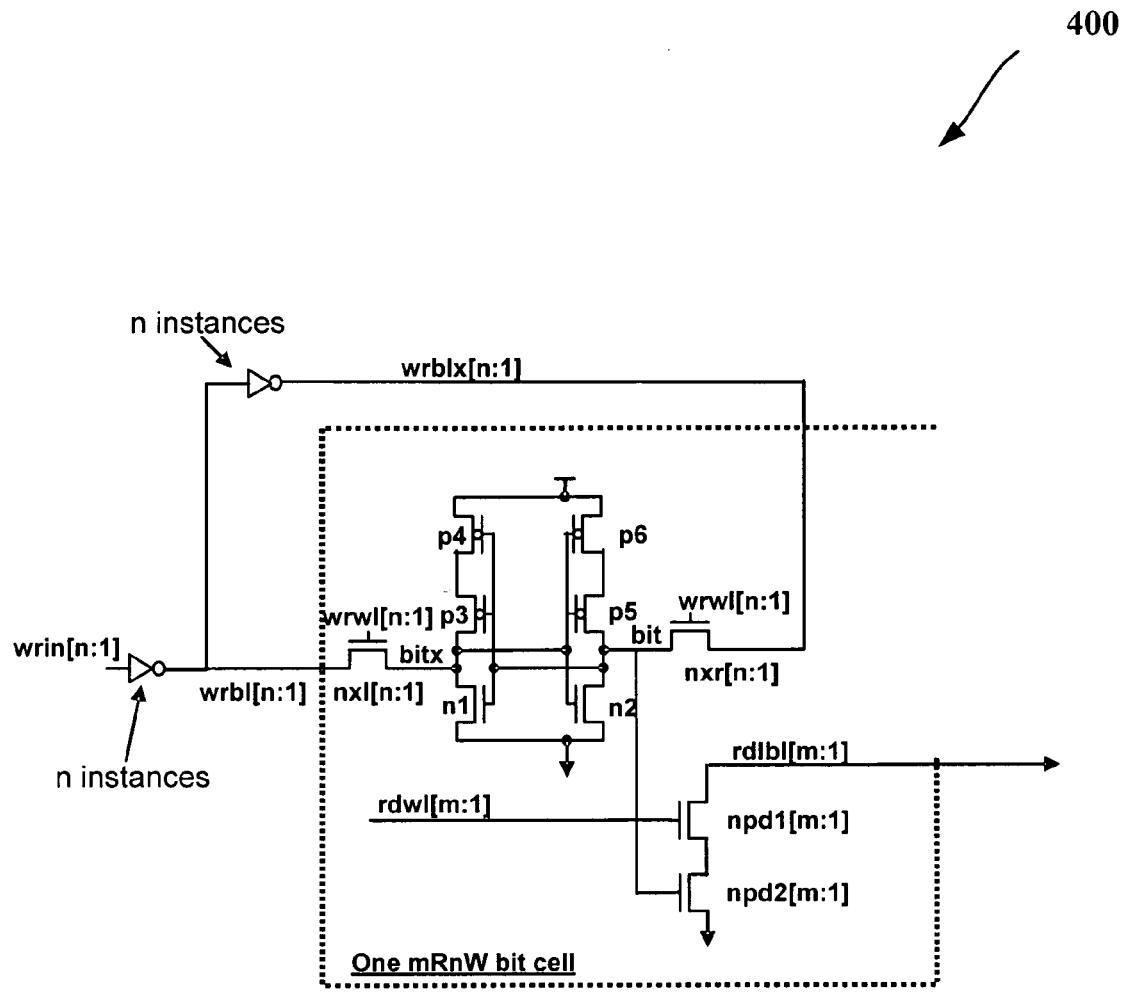

As shown in FIG. 1, rather than utilizing single cross-coupled invertor "jam" p-channel devices (such as a p-channel Field Effect Transistor (pFET)) (which would include one of the p3 or p4 transistors coupled in series with n1 or one of the p6 or p5 transistors coupled in series with n2) a two-high p-channel stack {p3,p4} and {p5,p6} jam pull-up (referred to herein also as "jam pup") may be used in an embodiment. Both p-channel devices in a stack are data driven such as shown in FIG. 1. In particular, p-channel stack {p3,p4} is driven by node "bit," and p-channel stack {p5,p6} is driven by node "bitx." Furthermore, in some embodiments (such as that shown in FIG. 4, where m is the number of read ports and n is the number of write ports), bit cells with multiple read and/or write ports may also be provided where two-high p-channel stack (such as shown in FIG. 1) is used for each of the multi-ported bit cells.

In some embodiments, utilizing a two-high p-channel stack such as shown in FIG. 1 may enables improved write 0 jam ratio in same bit cell area. More particularly, the transfer devices are the n-channel devices {nx1, nxr} in FIG. 1. The "write 0 jam ratio" is defined as strength of transfer device over strength of the jam pup. The variation tolerance of the write operation (and the low voltage performance) improves with larger jam ratio. A single p-channel jam pup may not be readily downsized further, because it may typically be at the minimum transistor width limit. Therefore, the remaining option to improve the write 0 jam ratio in some designs may be to upsize the transfer devices {nx1, nxr}. Also, with a stacked p-channel jam pup, as illustrated in FIG. 1, it is possible to decrease jam pup strength significantly without hitting the minimum transistor width limit and, hence, improve the jam ratio. The layout cost of implementing the proposed p-channel stacking is considered to be low in an embodiment.

Further, utilizing a two-high p-channel stack such as shown in FIG. 1 may improve the variation tolerance of the jam pull up itself in an embodiment. More particularly, larger width devices generally result in lower 1 sigma Vt, Le variation. For fixed jam ratio, the stacked pull-up employs larger z devices in some embodiments. This translates into lower 1 sigma Vt and Le variation per device. Vt variation may be considered to be proportional to 1/SQRT(device_area) and Le variation may be proportional to 1/SQRT(device_width). Additionally, since the Vt variation of the two stacked p-channel devices may be uncorrelated, then the Vt variation impact can be reduced by $\sqrt{2}$, or approximately 30%. Le variation is similarly reduced (assuming Le covariance of stacked devices is zero). The jam pup may also be important for $\geq 80\%$ write 1 completion. Even though the stacking may enable nominally weaker jam pups, with the variation averaging benefit taken into account the write 1 completion delays actually improve. The Vt variation statistical averaging benefit may also imply that the write 1 completion delays are less sensitive to aging induced random Vt variation.

Also, utilizing a two-high p-channel stack such as shown in FIG. 1 may lower leakage in an embodiment. As discussed with reference to better write 0 jam ratio above, in some designs the low voltage write performance may be improved by upsizing the transfer devices. This may result in increase in leakage. The bit cell shown in FIG. 1 may improve low voltage performance by stacking the jam pup, with transfer sizing held constant (or even downsized). Therefore, leakage is improved in at least one of two ways: (a) leakage thru transfer devices may be lower; and/or (b) stacking the p-channel transistors may reduce leakage by 90% compared to unstacked structure.

In some embodiments, a two-high p-channel stack such as shown in FIG. 1 may result in faster write word line slopes, normalized by low voltage performance. In an embodiment, the transfer sizing may be held constant (or even downsized) while in other designs the transfer n-channel may need to be upsized. Therefore, the write word lines are faster with the embodiments discussed herein, as well as, for the same low voltage performance, some embodiments may allow larger array size since array size may be limited by the write word line slope limit.

Figure 2:
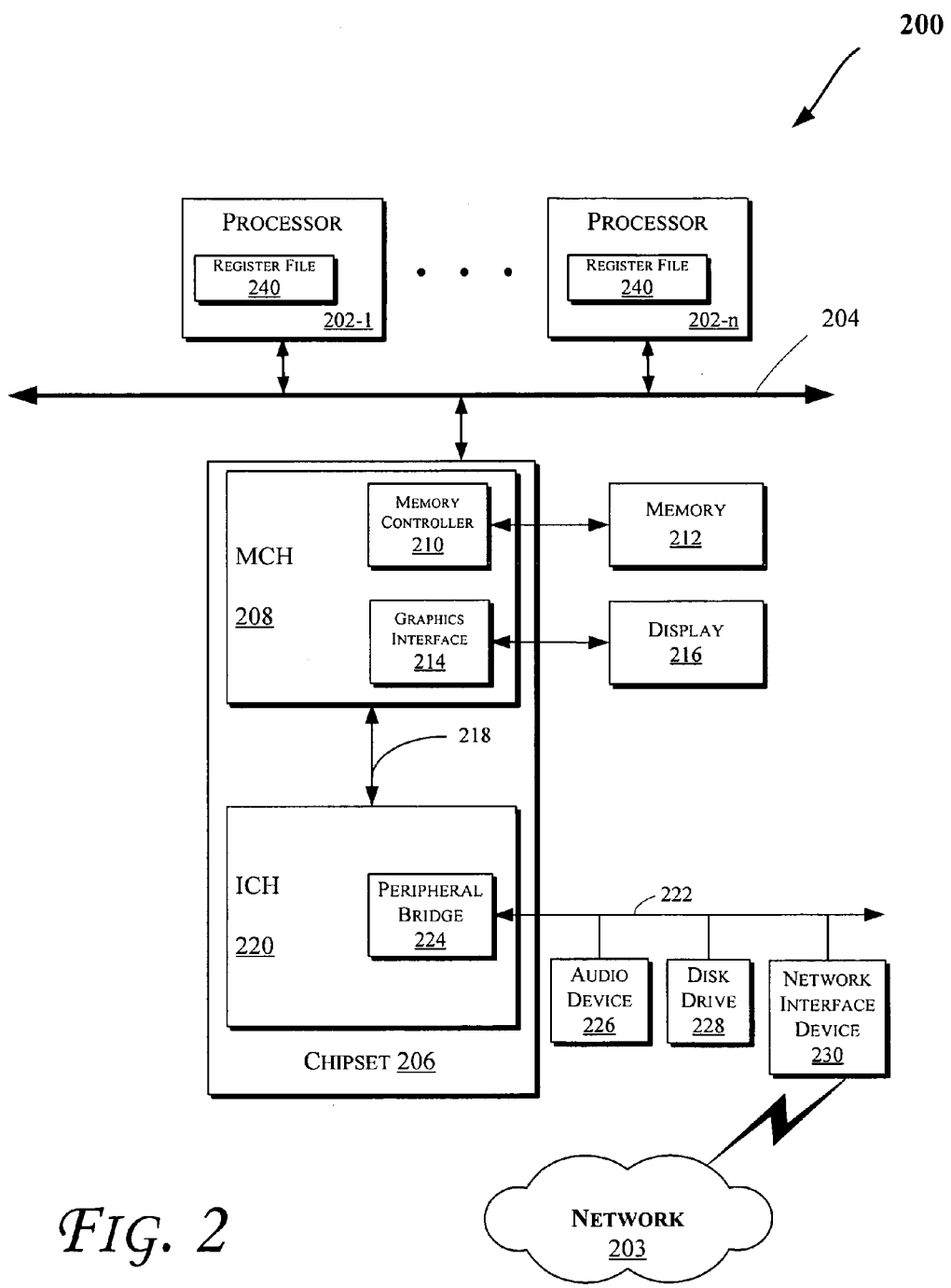
FIGS. 2 and 3 illustrate block diagrams of computing systems in accordance with various embodiments of the invention.

FIG. 2 illustrates a block diagram of a computing system 200 in accordance with an embodiment of the invention. The computing system 200 may include one or more central processing unit(s) (CPUs) 202 or processors that communicate via an interconnection network (or bus) 204. The processors 202 may include a general purpose processor, a network processor (that processes data communicated over a computer network 203), or other types of a processor (including a reduced instruction set computer (RISC) processor or a complex instruction set computer (CISC)). Moreover, the processors 202 may have a single or multiple core design. The processors 202 with a multiple core design may integrate different types of processor cores on the same IC die. Also, the processors 202 with a multiple core design may be implemented as symmetrical or asymmetrical multiprocessors. In an embodiment, one or more of the components discussed with reference to FIG. 2 (such as the processors 202) may include a register file 240 that may utilize bit cells such as that discussed with reference to FIG. 1.

A chipset 206 may also communicate with the interconnection network 204. The chipset 206 may include a memory control hub (MCH) 208. The MCH 208 may include a memory controller 210 that communicates with a memory 212. The memory 212 may store data, including sequences of instructions, that are executed by the CPU 202, or any other device included in the computing system 200. For example, operations may be coded into instructions (e.g., stored in the memory 212) and executed by processor(s) 202. In one embodiment of the invention, the memory 212 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 204, such as multiple CPUs and/or multiple system memories.

The MCH 208 may also include a graphics interface 214 that communicates with a display device 216. In one embodiment of the invention, the graphics interface 214 may communicate with the display device 216 via an accelerated graphics port (AGP). In an embodiment of the invention, the display 216 (such as a flat panel display) may communicate with the graphics interface 214 through, for example, a signal converter that translates a digital representation of an image stored in a storage device such as video memory or system memory into display signals that are interpreted and displayed by the display 216. The display signals produced by the display device may pass through various control devices before being interpreted by and subsequently displayed on the display 216.

A hub interface 218 may allow the MCH 208 and an input/output control hub (ICH) 220 to communicate. The ICH 220 may provide an interface to I/O device(s) that communicate with the computing system 200. The ICH 220 may communicate with a bus 222 through a peripheral bridge (or controller) 224, such as a peripheral component interconnect (PCI) bridge, a universal serial bus (USB) controller, or other types of peripheral bridges or controllers. The bridge 224 may provide a data path between the CPU 202 and peripheral devices. Other types of topologies may be utilized. Also, multiple buses may communicate with the ICH 220, e.g., through multiple bridges or controllers. Moreover, other peripherals in communication with the ICH 220 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 222 may communicate with an audio device 226, one or more disk drive(s) 228, and a network interface device 230 (which is in communication with the computer network 203). Other devices may communicate via the bus 222. Also, various components (such as the network interface device 230) may communicate with the MCH 208 via a high speed (e.g., general purpose) I/O bus channel in some embodiments of the invention. In addition, the processor 202 and other components shown in FIG. 2 (including but not limited to the MCH 208, one or more components of the MCH 208, etc.) may be combined to form a single chip. Furthermore, a graphics accelerator may be included within the MCH 208 in other embodiments of the invention.

Furthermore, the computing system 200 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 228), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 3:
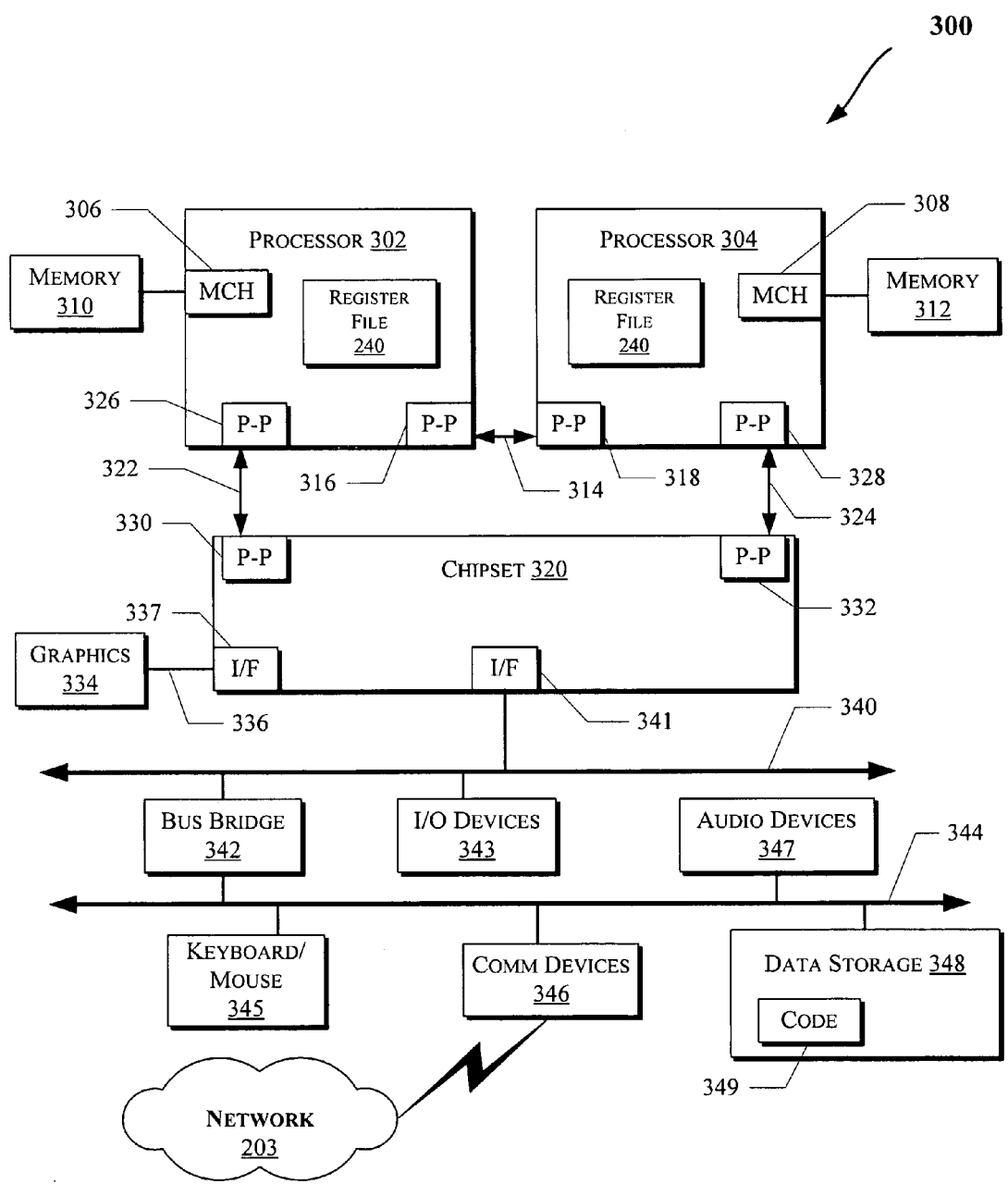

FIG. 3 illustrates a computing system 300 that is arranged in a point-to-point (PtP) configuration, according to an embodiment of the invention. In particular, FIG. 3 shows a system where processors, memory, and input/output devices are interconnected by a number of point-to-point interfaces. The operations discussed with reference to FIGS. 1-2 may be performed by one or more components of the system 300.

As illustrated in FIG. 3, the system 300 may include several processors, of which only two, processors 302 and 304 are shown for clarity. The processors 302 and 304 may each include a local memory controller (MC) 306 and 308 to enable communication with memories 310 and 312. The memories 310 and/or 312 may store various data such as those discussed with reference to the memory 212 of FIG. 2.

In an embodiment, the processors 302 and 304 may be one of the processors 202 discussed with reference to FIG. 2 (e.g., including the register file 240 that may utilize bit cells such as that discussed with reference to FIG. 1). The processors 302 and 304 may exchange data via a point-to-point (PtP) interface 314 using PtP interface circuits 316 and 318, respectively. Further, the processors 302 and 304 may include a high speed (e.g., general purpose) I/O bus channel in some embodiments of the invention to facilitate communication with various components (such as I/O device(s)). Also, the processors 302 and 304 may each exchange data with a chipset 320 via individual PtP interfaces 322 and 324 using point-to-point interface circuits 326, 328, 330, and 332. The chipset 320 may further exchange data with a graphics circuit 334 via a graphics interface 336, e.g., using a PtP interface circuit 337.

At least one embodiment of the invention may be provided within the processors 302 and 304 (such as the register file 240). Other embodiments of the invention, however, may exist in other circuits, logic units, or devices within the system 300 of FIG. 3. Furthermore, other embodiments of the invention may be distributed throughout several circuits, logic units, or devices illustrated in the figures (such as utilization of the bit cell design discussed with reference to FIG. 1 in various components of FIGS. 2 and/or 3).

The chipset 320 may communicate with a bus 340 using a PtP interface circuit 341. The bus 340 may communicate with one or more devices, such as a bus bridge 342 and I/O devices 343. Via a bus 344, the bus bridge 342 may communicate with other devices such as a keyboard/mouse 345, communication devices 346 (such as modems, network interface devices, or other communication devices that may communicate with the computer network 203), audio I/O device 347, and/or a data storage device 348. The data storage device 348 may store code 349 that may be executed by the processors 302 and/or 304.

Reference in the specification to "one embodiment," "an embodiment," or "some embodiments" means that a particular feature, structure, or characteristic described in connection with the embodiment(s) may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A memory bit cell comprising:
a first plurality of p-channel transistors;
a first n-channel transistor coupled to at least one of the first plurality of p-channel transistors, wherein the first plurality of p-channel transistors and the first n-channel transistor are to store a bit of data;
a second plurality of p-channel transistors; and
a second n-channel transistor coupled to at least one of the second plurality of p-channel transistors, wherein the second plurality of p-channel transistors and the second n-channel transistor are to store a complementary version of the bit.

2. The memory bit cell of claim 1, further comprising a read port to read data stored in the memory bit cell and a write port to write data to the memory bit cell.

3. The memory bit cell of claim 2, further comprising a plurality of n-channel transistors, wherein the read port is coupled to at least one of the plurality of n-channel transistors.

4. The memory bit cell of claim 1, further comprising one or more read ports to read data stored in the memory bit cell and one or more write ports to write data to the memory bit cell.

5. The memory bit cell of claim 1, wherein the first plurality of p-channel transistors are stacked and the second plurality of p-channel transistors are stacked.

6. The memory bit cell of claim 1, wherein the first plurality of p-channel transistors and the first n-channel transistor form a first invertor.

7. The memory bit cell of claim 6, wherein the second plurality of p-channel transistors and the second n-channel transistor form a second invertor.

8. The memory bit cell of claim 7, wherein the first and second invertors are cross-coupled.

9. A processor comprising:
a processor core; and
a register file to store one or more bits of data, wherein at least one of the bits of data is to be stored in a memory bit cell comprising:
a first plurality of p-channel transistors;
a first n-channel transistor coupled to at least one of the first plurality of p-channel transistors, wherein the first plurality of p-channel transistors and the first n-channel transistor are to store a bit of data;
a second plurality of p-channel transistors; and
a second n-channel transistor coupled to at least one of the second plurality of p-channel transistors, wherein the second plurality of p-channel transistors and the second n-channel transistor are to store a complementary version of the bit.

10. The processor of claim 9, further comprising a read port to read data stored in the memory bit cell and a write port to write data to the memory bit cell.

11. The processor of claim 10, further comprising a plurality of n-channel transistors, wherein the read port is coupled to at least one of the plurality of n-channel transistors.

12. The processor of claim 9, further comprising one or more read ports to read data stored in the memory bit cell and one or more write ports to write data to the memory bit cell.

13. The processor of claim 9, wherein the first plurality of p-channel transistors are stacked and the second plurality of p-channel transistors are stacked.

14. The processor of claim 9, wherein the first plurality of p-channel transistors and the first n-channel transistor form a first invertor and the second plurality of p-channel transistors and the second n-channel transistor form a second invertor, wherein the first and second invertors are cross-coupled.

15. The processor of claim 9 comprising a plurality of processor cores.

* * * * *